(12) United States Patent
Senzaki et al.

(10) Patent No.: US 8,617,795 B2
(45) Date of Patent: *Dec. 31, 2013

(54) PHOTOSENSITIVE RESIN COMPOSITION AND PATTERN FORMING METHOD USING THE SAME

(75) Inventors: Takahiro Senzaki, Kawasaki (JP);
Koichi Misumi, Kawasaski (JP);
Atsushi Yamanouchi, Kawasaki (JP);
Koji Saito, Kawasaki (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 866 days.

This patent is subject to a terminal disclaimer.

(21) Appl. No.: 12/223,913

(22) PCT Filed: Feb. 15, 2007

(86) PCT No.: PCT/JP2007/052700
§ 371 (c)(1),
(2), (4) Date: Jan. 3, 2011

(87) PCT Pub. No.: WO2007/094396
PCT Pub. Date: Aug. 23, 2007

(65) Prior Publication Data
US 2011/0123928 A1  May 26, 2011

(30) Foreign Application Priority Data
Feb. 16, 2006 (JP) .................................. 2006-040022

(51) Int. Cl.
G03F 7/40 (2006.01)
G03F 7/004 (2006.01)
G03F 7/038 (2006.01)

(52) U.S. Cl.
USPC ....................................... 430/280.1; 430/325

(58) Field of Classification Search
None
See application file for complete search history.

(56) References Cited

U.S. PATENT DOCUMENTS

| | | | |
|---|---|---|---|
| 3,526,504 A * | 9/1970 | Richard | 430/271.1 |
| 5,157,078 A * | 10/1992 | Woo et al. | 525/109 |
| 6,391,523 B1 | 5/2002 | Hurditch et al. | |
| 7,977,030 B2 * | 7/2011 | Senzaki et al. | 430/280.1 |
| 8,288,078 B2 * | 10/2012 | Senzaki et al. | 430/280.1 |
| 2003/0176519 A1 * | 9/2003 | Crivello | 522/7 |
| 2006/0188820 A1 * | 8/2006 | Maeda | 430/311 |
| 2007/0225458 A1 * | 9/2007 | Kimura et al. | 526/179 |

FOREIGN PATENT DOCUMENTS

| | | |
|---|---|---|
| JP | 7-78628 | 3/1995 |
| JP | 9-268205 | 10/1997 |
| JP | 10-97068 | 4/1998 |
| JP | 10-123712 | 5/1998 |
| JP | 11-322900 | 11/1999 |
| JP | 2000-136230 | 5/2000 |
| JP | 2005-17321 | 1/2005 |
| JP | 2005-055865 | 3/2005 |
| JP | 2006-023405 | 1/2006 |
| WO | WO-2005/116038 A1 * | 12/2005 |
| WO | WO-2006/004171 A1 * | 2/2006 |

OTHER PUBLICATIONS

English translation of JP, 2000-136230, A (200) from machine translation from AIPN Japan Patent Office National Center for Industrial Property Information and Training, generated Dec. 17, 2012.*

* cited by examiner

*Primary Examiner* — Cynthia Hamilton
(74) *Attorney, Agent, or Firm* — Wenderoth, Lind & Ponack, L.L.P.

(57) ABSTRACT

Problem: Providing a photosensitive resin composition that has high sensitivity, sustains a slight shrinkage in volume when cured under heating and can form resist patterns having high-aspect profiles, and a pattern forming method using such a composition.

Means for Resolution: A photosensitive resin composition characterized by containing (a) a polyfunctional epoxy resin, (b) a cationic polymerization initiator and (c) an aromatic polycyclic compound as a sensitizer (such as 2,3-dihydroxynaphthalene, 1,5-dihydroxynaphthalene or 2,6-dihydroxynaphthalene), which has at least two substituents capable of forming cross-links with component (a).

10 Claims, No Drawings

PHOTOSENSITIVE RESIN COMPOSITION AND PATTERN FORMING METHOD USING THE SAME

TECHNICAL FIELD

The present invention relates to a photosensitive resin composition allowing fabrication of minute molded-resin products, which have thick-film and ultrafine pattern widths, by resin pattern formation using photolithographic technology, and to a pattern forming method using this composition. More specifically, the invention is concerned with a high-sensitivity, high-resolution photosensitive resin composition allowing formation of ultrafine resin patterns having line widths on the order of 10 μm, and with a pattern forming method using this composition. The invention is applied suitably to the fabrication of electronic devices including MEMS (Micro Electro Mechanical Systems), an inkjet recording head and so on.

BACKGROUND ART

With the recent downsizing in the field of electronic devices including MEMS, an inkjet recording head and so on, there has been a growing demand for photosensitive resin compositions that allow fabrication of minute molded-resin products and formation of resin patterns with fine pattern widths of a few tens to a few hundreds of micrometers and high aspect ratios.

However, in the case of performing pattern formation by use of a photosensitive resin layer incorporating a traditional photosensitive resin composition which contained a novolak resin and diazonaphthoquinone as a photoacid generator, it was difficult to provide a profile having a high aspect ratio up to such a great height as a few hundred micrometers of film thickness. This was because, since the diazonaphthoquinone-type photoacid generator had high absorbency in the near ultraviolet region used for exposure, there was a great difference in exposure intensity of radiation between the top portion and the bottom portion of film when the photosensitive resin layer was thick film; as a result, the profiles of resin patterns formed had a taper shape or became contorted.

By contrast, there are proposals of photosensitive resin compositions capable of ensuring pattern profiles with high aspect ratios by containing combinations of photosensitive resins having functional groups, such as epoxy groups, with acid generators.

As to such photosensitive resin compositions, there are reports of, e.g., the light-curable composition which includes an epoxy-functional novolak resin, a cation-producing photoinitiator, such as a triarylsulfonium salt, and a diluent capable of reacting with an epoxy functional group and resists delamination because it is cured to perfection (Patent Document 1), the light-curable composition which includes a polyfunctional bisphenol A-formaldehyde novolak resin, triphenylsulfonium hexafluoroantimonate as an acid generator and a cyclopentanone solvent and allows formation of thick film (Patent Document 2), and so on.

On the other hand, a variety of acid generators other than diazonaphthoquinone-type acid generators have been developed for the purpose of providing highly sensitive resin compositions for optical molding. As examples thereof, aromatic sulfonium cationic polymerization initiators can be given. As to specific examples of photosensitive resin compositions containing such acid generators as an improvement factor, there are proposals of the resin compositions containing cation-polymerizable organic compounds and energy radiation-responsive cationic polymerization initiators (Patent Document 3 and Patent Document 4), and so on. In addition, the permanent resist composition containing a cationic polymerization initiator invested with an ability to absorb exposure light with wavelengths of 360 nm or above (Patent Document 5), and so on have been proposed too.

Patent Document 1: JP-B-7-78628
Patent Document 2: U.S. Pat. No. 6,391,523
Patent Document 3: JP-A-9-268205
Patent Document 4: JP-A-2005-055865
Patent Document 5: JP-A-10-097068

DISCLOSURE OF THE INVENTION

Problems that the Invention is to Solve

However, the traditional photosensitive resin compositions containing combinations of photosensitive resins having functional groups, such as epoxy groups, and acid generators are required to contain initiators in large quantity because of low sensitivity of the cationic polymerization initiators mixed therein, such as triphenylsulfonium hexafluoroantimonate. So, they have a problem that mask patterns cannot be reproduced faithfully on resin patterns. As to the proposal of enhancing sensitivity of the cationic polymerization initiator in itself by imparting thereto an ability to absorb exposure light with wavelengths of 360 nm or above, the fact was that such a cationic polymerization initiator was not in a state of availability of practicable ones. Further, since the cationic polymerization initiators including triphenylsulfonium hexafluoroantimonate and the like achieve their high sensitivities by containing antimony, arsenic or the like in their respective anionic parts, they have a problem that their anion species are detrimental to humans and the environment.

The invention has been made in view of the existing circumstances mentioned above, and problems of the invention are to provide a photosensitive resin composition which can deliver an outstanding resolving property, and more specifically, sustains a slight shrinkage in volume when cured under heating and can form patterns having profiles with high aspect ratios, and besides, which has high sensitivity, and to provide a pattern forming method using such a photosensitive resin composition.

Means for Solving the Problems

As a result of our intensive studies on enhancement of sensitivity and resolution in photosensitive resin compositions for the purpose of solving the foregoing problems, it has been found that, when a photosensitive resin composition is prepared using a polyfunctional epoxy resin and a cationic polymerization initiator in combination with a specific sensitizer, and resin patterns are formed with this photosensitive resin composition, resin patterns sustaining a slight shrinkage in volume when cured under heating and having profiles with high aspect ratios can be formed in high sensitivity, thereby achieving the invention.

The invention therefore provides a photosensitive resin composition characterized by containing (a) a polyfunctional epoxy resin, (b) a cationic polymerization initiator, and (c) an aromatic polycyclic compound as a sensitizer, which has at least two substituents capable of forming cross-links with component (a).

In addition, the invention provides a photosensitive resin composition laminate which is prepared by providing protective films on both sides of a photosensitive resin composition layer, where said layer is formed from the foregoing photosensitive resin composition.

Further, the invention provides a pattern forming method which comprises applying the foregoing photosensitive resin composition on a substrate, drying it, thereby to form a photosensitive resin composition layer, and thereafter selectively exposing the photosensitive resin composition layer, and developing the said exposed photosensitive resin composition layer to form a resist pattern, then heating it, thereby to form a specified-shaped cured resin pattern.

Furthermore, the invention provides a pattern forming method which comprises sticking on a substrate of one side (bottom side) of the foregoing photosensitive resin composition laminate after the protective layer is removed away therefrom, then removing away the protective layer from on the other side (topside) of the laminate, and thereafter selectively exposing the photosensitive resin composition layer on the substrate, and developing the said exposed layer to form a resist pattern, then heating it, thereby to form a specified-shaped cured resin pattern.

Moreover, the invention provides a pattern forming method which comprises sticking on a substrate of one side (bottom side) of the foregoing photosensitive resin composition laminate after the protective layer is removed away therefrom, then selectively exposing the photosensitive resin composition laminate on the substrate, and thereafter removing away the protective layer from on the other side (topside) of the laminate, and developing the exposed photosensitive resin composition to form a resist pattern, then heating it, thereby to form a specified-shaped cured resin pattern.

Advantage of the Invention

The invention allows highly sensitive formation of resin patterns which sustain a slight shrinkage in volume when cured under heating and have high-aspect profiles. As a consequence, the effect of enabling minute molding of resins which is satisfactory in dimensional stability can be achieved.

BEST MODE FOR CARRYING OUT THE INVENTION

The present photosensitive resin composition contains (a) a polyfunctional epoxy resin, (b) a cationic polymerization initiator and (c) an aromatic polycyclic compound as a sensitizer, which has at least two substituents capable of forming cross-links with component (a). By such a constitution of the composition, resin patterns sustaining a slight shrinkage in volume under heat-curing and having high-aspect profiles can be formed in higher sensitivity.

The polyfunctional epoxy resin of component (a) may be any epoxy resin as far as it has epoxy groups in sufficient numbers per molecule for formation of thick-film patterns. Examples of such a polyfunctional epoxy resin include phenol novolak-type epoxy resins, ortho-cresol novolak-type epoxy resins, triphenyl novolak-type epoxy resins, bisphenol A novolak-type epoxy resins, and the like. Of these compounds, polyfunctional bisphenol A novolak-type epoxy resins are preferable to the others, and the functionality thereof is preferably penta-functionality or above. In particular, octafunctional bisphenol A novolak-type epoxy resins (e.g., Epikote 157S70, produced by Japan Epoxy Resins Co., Ltd.) and bisphenol A novolak-type epoxy resins (e.g., Epiclon N-775, produced by DIC Corporation) are preferred.

The polyfunctional bisphenol A novolak-type epoxy resins are represented by the following formula (1).

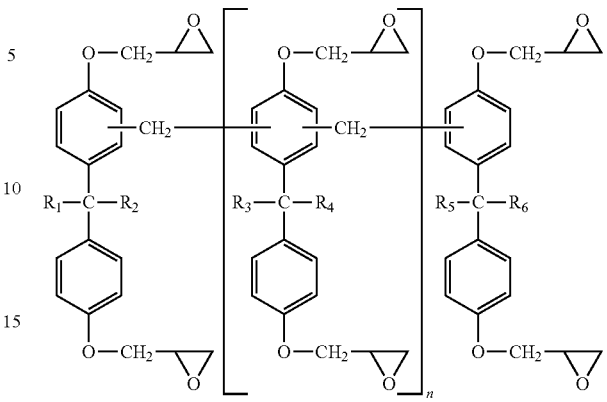

(1)

[In formula (1), each of $R_1$ to $R_6$ represents a hydrogen atom or $CH_3$, and n represents 0 or an integer.]

The epoxy groups in the polyfunctional bisphenol A novolak-type epoxy resins represented by the above (1) may also be polymers polymerized with bisphenol A-type epoxy resins or bisphenol A novolak-type epoxy resins.

The softening point of the polyfunctional epoxy resin as component (a) has no particular limitations so long as the resin is a solid matter at ordinary temperatures. In the case of forming a dry-film resist, it is undesirable that the resist softens at ordinary temperatures (about 40° C.), and the resist is required to soften by heating at the time of lamination. In this respect, the softening point of component (a) is preferably from about 50° C. to about 100° C., more preferably from about 60° C. to about 80° C.

The amount of component (a) is preferably from 80 to 99.9 mass %, more preferably from 92 to 99.4 mass %, of the present photosensitive resin composition (the total solids content). By adjusting the amount of component (a) to the foregoing range, the film having high sensitivity and appropriate hardness can be formed when the photosensitive resin composition is coated on a substrate.

The cationic polymerization initiator as component (b) is a compound which, when exposed to radiation, such as ultraviolet radiation, far ultraviolet radiation, KrF or ArF excimer laser radiation, X-ray radiation or electron-beam radiation, generates a cation capable of functioning as a polymerization initiator.

As to one aspect of the cationic polymerization initiator of component (b), the compounds represented by the following formula (2), whose cations are formed from sulfonium salts, can be given as suitable examples.

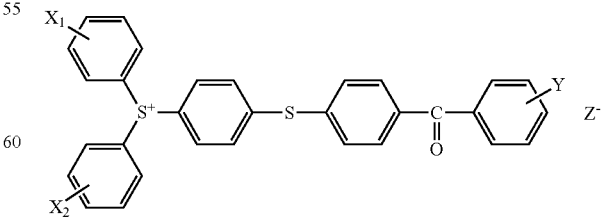

(2)

In formula (2), each substituent has the following meaning.

Each of $X_1$ and $X_2$ independently represents a hydrogen atom, a halogen atom, an oxygen atom, a hydrocarbon group which may has a halogen atom, or an alkoxy group to which a substituent may be bound. Of these substituents, a halogen atom is preferred over the others, and a fluorine atom is more preferable.

Y represents a hydrogen atom, a halogen atom, an oxygen atom, a hydrocarbon group which may has a halogen atom, or an alkoxy group to which a substituent may also be bound. Of these substituents, a halogen atom is preferred, and a chlorine atom is more preferable.

$Z^-$ represents an anion as a constituent of component (b), with examples including $SbF_6^-$, $AsF_6^-$, $PF_6^-$, $BF_4^-$, $B(C_6F_5)_4^-$ and the like.

Examples of a cation as the other constituent of component (b) include 4-(4-benzoylphenylthio)phenyldiphenylsulfonium, 4-(4-benzoylphenylthio)phenylbis(4-hydroxyethyloxyphenyl)sulfonium, 4-(4-benzoylphenylthio)phenylbis(4-fluorophenyl)sulfonium, 4-(4-benzoylphenylthio)phenylbis(4-chlorophenyl)sulfonium, 4-{4-(3-chlorobenzoyl)phenylthio}phenylbis(4-fluorophenyl)sulfonium, 4-(4-benzoylphenylthio)phenylbis(4-methylphenyl)sulfonium, 4-(4-benzoylphenylthio)phenylbis(4-hydroxyethylphenyl)sulfonium, 4-{4-(4-hydroxyethyloxybenzoyl)phenylthio}phenylbis(4-fluorophenyl)sulfonium, 4-{4-(4-hydroxyethyloxybenzoyl)phenylthio}phenyldiphenylsulfonium, 4-{4-(4-hydroxyethyloxybenzoyl)phenylthio}phenylbis(4-hydroxyethyloxyphenyl)sulfonium, 4-(4-benzoylphenylthio)phenylbis(4-methoxyethoxyphenyl)sulfonium, 4-{4-(3-methoxybenzoyl)phenylthio}phenyldiphenylsulfonium, 4-{4-(3-methoxycarbonylbenzoyl)phenylthio}phenyldiphenylsulfonium, 4-{4-(2-hydroxymethylbenzoyl)phenylthio}phenyldiphenylsulfonium, 4-{4-(4-methylbenzoyl)phenylthio}phenylbis(4-fluorophenyl)sulfonium, 4-{4-(4-methoxybenzoyl)phenylthio}phenylbis(4-fluorophenyl)sulfonium, 4-{4-(4-fluorobenzoyl)phenylthio}phenylbis(4-fluorophenyl)sulfonium, 4-{4-(2-methoxycarbonylbenzoyl)phenylthio}phenylbis(4-fluorophenyl)sulfonium, and the like. However, the cation should not be limited to these examples.

Of these cations, 4-(4-benzoylphenylthio)phenyldiphenylsulfonium, 4-(4-benzoylphenylthio)phenylbis(4-hydroxyethyloxyphenyl)sulfonium, 4-(4-benzoylphenylthio)phenylbis(4-fluorophenyl)sulfonium, 4-(4-benzoylphenylthio)phenylbis(4-chlorophenyl)sulfonium and 4-{(4-(3-chlorobenzoyl)phenylthio}phenylbis(4-fluorophenyl)sulfonium are preferred.

Suitable examples of component (b) of such a sulfonium salt type include triarylsulfonium hexafluoroantimonate (Adeka Optomer SP-172, produced by Adeka Corporation), a mixture of diphenyl[4-(phenylthio)phenyl]sulfonium hexafluorophosphate and thiodi-p-phenylenebis(diphenylsulfonium)bis(hexafluorophosphate) (UVI-6992, produced by The Dow Chemical Company), and the like. However, component (b) of a sulfonium salt type should not be limited to these examples.

As to another aspect of component (b), the compounds represented by the following formulae (3) and (4), whose cations are formed from iodonium salts, are given as examples.

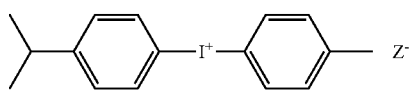

(3)

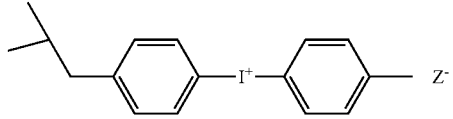

(4)

$Z^-$ in formulae (3) and (4) each has the same meaning as defined in formula (2).

Suitable examples of component (b) of such an iodonium salt type include DI-1 and DI-2 (both of which are products of Ciba Specialty Chemicals).

The amount of component (b) is preferably from 0.1 to 10 mass %, more preferably from 0.5 to 5 mass %, of the present photosensitive resin composition (the total solids content). By adjusting the amount of component (b) to the foregoing range, satisfactory development characteristics and curing characteristics of film can be achieved.

The sensitizer as component (c) is an aromatic polycyclic compound having at least two substituents capable of forming cross-links with component (a). By the sensitizing function of such an aromatic polycyclic compound, the photosensitive resin composition can be increased in sensitivity. In addition, since it has at least two cross-linkable substituents, the compound can enhance the density of cross-links in component (a) to increase the density of film itself which includes the photosensitive resin layer, and can impart high hardness and low percentage of water absorption to the photosensitive resin layer. Further, a plurality of aromatic rings present in component (c) make it possible to let the photosensitive resin composition have high Tg, high curingness and a low coefficient of thermal expansion.

Examples of a substituent capable of forming a cross-link with component (a) include a hydroxyl group, a carboxyl group, an amino group and so on. Component (c) contains at least two substituents of at least one kind selected from among those groups.

Examples of a compound as component (c) include a naphthalene compound, a dinaphthalene compound, an anthracene compound, a phenanthroline compound and the like, and it is preferable that at least one kind of aromatic polycyclic compound selected from among those compounds is used as component (c). Of those compounds, a naphthalene compound and an anthracene compound are especially preferred over the others.

More specifically, 1,2-dihydroxynaphthalene, 1,3-dihydroxynaphthalene, 1,4-dihydroxynaphthalene, 1,5-dihydroxynaphthalene, 1,6-dihydroxynaphthalene, 1,7-dihydroxynaphthalene, 1,8-dihydroxynaphthalene, 2,3-dihydroxynaphthalene, 2,6-dihydroxynaphthalene, 2,7-dihydroxynaphthalene, 9,10-dihydroxynaphthalene and so on can be given as examples.

Of these naphthalene compounds, 1,5-dihydroxynaphthalene, 2,3-dihydroxynaphthalene and 2,6-dihydroxynaphthalene are especially preferred from the viewpoint of enhancing the cross-linking efficiency.

The amount of component (C) is preferably from 0.1 to 50 mass %, more preferably from 0.1 to 3 mass, of the present photosensitive resin composition (the total solids content). By adjusting the amount of component (c) to the foregoing range, the desired effects can be attained without worsening pattern shapes.

The present photosensitive resin composition can further contain (d) a macromolecular straight-chain bifunctional epoxy resin for the purpose of improving film formability.

As component (d), the compound represented by the following formula (5) can be suitably used.

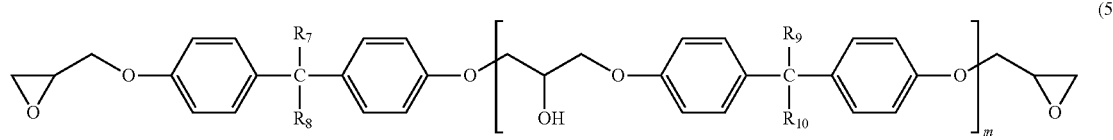

[In formula (5), each of $R_7$ to $R_{10}$ represents a hydrogen atom or $CH_3$, and m is an integer.]

The compound represented by the formula (5) is a polymerization product of bisphenol A-type epoxy or bisphenol F-type epoxy, and the average molecular weight thereof is preferably from 2,000 to 7,000, more preferably from 3,000 to 5,000. The compound having an average molecular weight lower than 2,000 yields no improvement in film formability, while the compound having an average molecular weight higher than 7,000 has no compatibility with component (a). More specifically, bisphenol A-type epoxy resin (Epikote 1009 (average molecular weight: 3750), produced by Japan Epoxy Resins Co., Ltd.) is especially suitable as component (d).

The present photosensitive resin composition may further contain an organic solvent as component (e). By adding component (e), the resulting photosensitive resin composition can achieve higher sensitivity. Examples of component (e) include γ-butyrolactone, propylene carbonate, propylene glycol monomethyl ether acetate (PGMEA), methyl isobutyl ketone, butyl acetate, methyl amyl ketone, 2-heptanone, ethyl acetate, methyl ethyl ketone, and so on.

Of these organic solvents, when the present photosensitive resin composition is used in the form of a solution, γ-butyrolactone and/or propylene carbonate is preferable to the others in the sense that the organic solvent is captured in the photosensitive resin composition through reaction with the photosensitive resin composition solution. On the other hand, when the present photosensitive resin composition is used in the form of a laminate made by forming the composition into film by drying and laminating a protective film (base film), at least one kind of solvent selected from propylene glycol monomethyl ether acetate, methyl isobutyl ketone, butyl acetate or methyl amyl ketone is preferred from the viewpoints of wettability with the base film and surface tension.

The present photosensitive resin composition may further contain as component (f) one or more than one kind of derivative selected from among oxetane derivatives and epoxy derivatives. When the composition is formed into a dry film resist, the mixing of an oxetane derivative or/and an epoxy derivative can yield an improvement in elasticity of the photosensitive resin composition before it is cured without degrading physical properties of the photosensitive resin composition after it is cured.

The oxetane derivatives are not limited to particular ones, and examples thereof include 3-ethyl-3-hydroxymethyloxetane, 1,4-bis{[(3-ethyl-3-oxetanyl)methoxy]methyl}benzene, di[1-ethyl(3-oxetanyl)]methyl ether, and so on.

Examples of the epoxy derivatives include bisphenol A-type epoxy resins, bisphenol F-type epoxy resins and the like, whose respective average molecular weights are 7,000 or below, preferably 2,000 or below, more preferably 1,000 or below. More specifically, bisphenol A-type epoxy resin (Epikote 828 (average molecular weight: 380), produced by Japan Epoxy Resins Co., Ltd.) can be given as an example.

Into the present photosensitive resin composition, miscible additives commonly used for improvement in pattern performance, such as an additive resin, a plasticizer, a stabilizer, a colorant, a surfactant, a coupling agent (A-186, A-187, etc., produced by Dow Corning Corporation) and a leveling agent, can further be mixed in appropriate amounts upon request so long as the mixing thereof does not impair the effects of the invention.

As to a usage embodiment of the present photosensitive resin composition, it is all right to use the photosensitive resin composition in the form of cured film which is prepared by coating and drying a solution of the photosensitive resin composition on a substrate and then by curing the composition, or in the form of a laminate made by forming the photosensitive resin composition into film, protecting both sides of this film with resin films, thereby making a laminate of the dry-film-like photosensitive resin composition, and sticking this laminate on a substrate before pattern exposure.

In the case of providing the present photosensitive resin composition in the form of a dry-film-like photosensitive resin composition laminate, it is preferred that, when one side of the photosensitive resin composition is protected with polyethylene terephthalate film, the polymer film as the protective film on the other side be either polyethylene terephthalate film, or polypropylene film, or polyethylene film.

When the photosensitive resin composition is provided in the form of film as mentioned above, it becomes possible to omit the processes of coating on a substrate and drying; as a result, the pattern formation using the present photosensitive resin composition can be more simplified.

When the pattern forming method of the invention is a method including, e.g., processes of dissolving the present photosensitive resin composition in a solvent, coating the resulting solution on a substrate, or a board such as a silicon wafer, by means of a spin coater or the like, drying the solution coated, thereby forming a layer of the photosensitive resin composition, performing pattern exposure of the resin composition layer to radiation and further subjecting the exposed layer to development-processing with a developer, good-quality resin patterns faithful to mask patterns used can be formed without depending on the substrate used.

Alternatively, good-quality resin patterns faithful to mask patterns can be formed by making the present photosensitive resin composition into the dry-film-like laminate as mentioned above, removing the protective film on one side (on the bottom side) and sticking the resulting laminate on a substrate, then removing the protective film on the other side (on the topside), thereafter performing pattern exposure of the photosensitive resin composition layer to radiation, and further subjecting the exposed layer to development-processing with a developer. In this way, it becomes possible to achieve minute molding of resins with excellent dimensional stability, which is required for molding of electronic devices, such as inkjet recording heads.

Further, good-quality resin patterns faithful to mask patterns can be formed by making the present photosensitive resin composition into the dry-film-like laminate as mentioned above, removing the protective film on one side (on the bottom side) and sticking the resulting laminate on a substrate, performing pattern exposure of this photosensitive resin composition laminate to radiation, then removing the protective film on the other side (on the topside), and further performing development-processing with a developer. In this way, it becomes possible to achieve good-quality minute molding of resin without causing warp in the laminate of the photosensitive resin composition when the laminate of the present photosensitive resin composition is required to be provided on a resist pattern and further to undergo resist patterning in molding of electronic devices, such as MEMS.

EXAMPLES

Next, the invention is illustrated in greater detail by reference to the following examples, but the invention should not be construed as being limited to these examples in any way.
<Preparation of Photosensitive Resin Composition>

Photosensitive resin compositions having makeups shown in the following Table 1 (amount: part by mass) were prepared.

Patterning of Photosensitive Resin Composition

Examples 1 to 4, Comparative Examples 1 and 2

Each of the photosensitive resin compositions shown in Examples 1 to 4 and Comparative Examples 1 and 2 of Table 1 was coated on a silicon wafer by means of a spin coater, and then dried, thereby forming a photosensitive resin composition layer having a thickness of 30 μm. Each of these photosensitive resin composition layers was pre-baked at 60° C. for 5 minutes and further at 90° C. for 5 minutes by means of a hot plate. Thereafter, pattern exposure (soft contact, GHI-ray) was performed by use of PLA-501F (a contact aligner, made by Canon Inc.), then postexposure bake (PEB) was carried out at 90° C. for 5 minutes by using of a hot plate, and further development processing was carried out for 4 minutes in accordance with an immersion method using propylene glycol monomethyl ether acetate (PGMEA). Next, the resin patterns after the development, together with the substrates, were postbaked at 200° C. for 1 hour by use of an oven. Thus, cured resin patterns were obtained on the substrates, respectively.

Examples 5 and 6

Each of the photosensitive resin compositions shown in Examples 5 and 6 of Table 1 was coated uniformly on a 38 μm thick release agent-attached polyethylene terephthalate (PET) film (a substrate film, produced by Teijin Limited), dried at 65° C. for 5 minutes and further at 80° C. for 5 minutes by means of a hot-air convection drier, and then a 25 μm-thick release agent-attached PET (a protective film) was laminated on the exposed surface, thereby forming a dry-film resist (a laminate) having a 30 μm-thick photosensitive resin composition layer.

The protective film of this laminate was peeled away, and the resulting laminate was laminated on a silicon wafer under conditions that the roll temperature was 80° C., the air pressure was 2 kg/m$^2$ and the speed was 0.5 m/min, thereby building up the photosensitive resin composition layer on the wafer. This photosensitive resin composition layer was subjected to pattern exposure (soft contact, GHI-ray) by use of PLA-501F (a contact aligner, made by Canon Inc.). Thereafter, PEB at 90° C. for 5 minutes was carried out by means of a hot plate, and then development processing was carried out for 4 minutes in accordance with an immersion method using PGMEA. Next, 1-hour postbake at 200° C. was performed by use of an oven. Thus, cured resin patterns were obtained on the substrates, respectively.
<Evaluation of Photosensitive Resin Composition>
(Luminous Exposure)

In the pattern forming process of each of Examples 1 to 4, Comparative Examples 1 and 2, and Examples 5 and 6, evaluation of sensitivity (resolving property) was made by determining the light exposure requirement after the development. Results obtained are shown in Table 1.
(Fine-Line Adhesion)

After the pattern formation in each of Examples 1 to 4, Comparative Examples 1 and 2, and Examples 5 and 6, the line width of the finest pattern adhering firmly in all the resin patterns formed was measured. Results obtained are shown in Table 1.

TABLE 1

|  |  | Example |  |  |  |  |  | Comparative Example |  |
|---|---|---|---|---|---|---|---|---|---|
|  | Component | 1 | 2 | 3 | 4 | 5 | 6 | 1 | 2 |
| Polyfunctional epoxy resin | (a) | 100 | 100 | 100 | 80 | 100 | 90 | 100 | 100 |
| Polymerization Initiator | (b) | 5 | 5 | 5 | 5 | 5 | 5 | 5 | 5 |
| Macromolecular epoxy resin | (d) | — | — | — | 20 | — | — | — | — |
| Sensitizer | (c-1) | 5 | — | — | 5 | 5 | 5 | — | — |
|  | (c-2) | — | 5 | — | — | — | — | — | — |
|  | (c-3) | — | — | 5 | — | — | — | — | — |
|  | (c-4) | — | — | — | — | — | — | 5 | — |
|  | (c-5) | — | — | — | — | — | — | — | 5 |
| Organic solvent | (e) | 43 | 43 | 43 | 43 | 43 | 43 | 43 | 43 |

TABLE 1-continued

|  | Component | Example 1 | Example 2 | Example 3 | Example 4 | Example 5 | Example 6 | Comparative Example 1 | Comparative Example 2 |
|---|---|---|---|---|---|---|---|---|---|
| Others | (f) | — | — | — | — | 0.1 | — | — | — |
|  | (y) | — | — | — | — | — | 10 | — | — |
| Luminous exposure (mJ) |  | 500 | 500 | 500 | 500 | 500 | 500 | 500 | 500 |
| Fine-line adhesion (μn) |  | 4 | 4 | 4 | 4 | 4 | 4 | 6 | 8 |

Each of the components shown in Table 1 is as follows.
(a): Polyfunctional bisphenol A novolak-type epoxy resin (Epikote 157S70, produced by Japan Epoxy Resins Co., Ltd.)
(b): Mixture of diphenyl[4-(phenylthio)phenyl]sulfonium hexafluorophosphate and thiodi-p-phenylenebis(diphenylsulfonium)bis(hexafluorophosphate (UVI-6992, produced by The Dow Chemical Company)
(d): Macromolecular bifunctional epoxy resin (Epikote 1009, produced by Japan Epoxy Resins Co., Ltd.)
(c-1): 1,5-Dihydroxynaphthalene
(c-2): 2,3-Dihydroxynaphthalene
(c-3): 2,6-Dihydroxynaphthalene
(c-4): 1-Naphthol
(c-5): Benzophenone
(e): γ-Butyrolactone
(f): 1,4-Bis{[(3-ethyl-3-oxetanyl)methoxy]methyl}benzene
(y): Panedat M (produced by Dow Corning Corporation) (leveling agent)

In all of Examples 1 to 6, good results were obtained. Further, these Examples were successful in preventing the resin pattern dimensions from thickening without causing any sensitivity drop by addition of dihydroxynaphthalenes.

The results shown in Table 1 indicate that resin patterns having high-aspect profiles and being slight in volume shrinkage under heat-curing were obtained in high sensitivity by use of the present photosensitive resin compositions. In addition, although resin pattern dimensions become thick as compared with the mask dimension when the photosensitive resin composition has high sensitivity, and besides, exposure is carried out in a condition that there is a gap between the mask and the resist surface, it was ascertained that the addition of component (c) as a sensitizer in the invention allowed inhibition of this thickening phenomenon without attended by any sensitivity drop.

INDUSTRIAL APPLICABILITY

The present photosensitive resin compositions are useful for formation of resin patterns having high-aspect profiles, and especially suitable for highly dimension-stabilized molding of resins in minute-size electronic devices or the like.

The invention claimed is:

1. A photosensitive resin composition comprising (a) a polyfunctional epoxy resin, (b) a cationic polymerization initiator, and (c) an aromatic polycyclic compound as a sensitizer, which has at least two substituents capable of forming cross-links with component (a),
   wherein component (a) is a polyfunctional bisphenol A novolak epoxy resin, and
   wherein component (c) is selected from the group consisting of mononaphthalene compounds, dinaphthalene compounds, anthracene compounds, phenanthroline compounds, and mixtures thereof.

2. The photosensitive resin composition as claimed in claim 1, wherein the substituents in component (c) capable of forming cross-links with component (a) are selected from the group consisting of hydroxyl, carboxyl, amino, and mixtures thereof.

3. The photosensitive resin composition as claimed in claim 1, wherein component (c) is a mononaphthalene compound, an anthracene compound or a mixture of these compounds.

4. The photosensitive resin composition as claimed in claim 1, wherein component (c) is selected from the group consisting of 2,3-dihydroxynaphthalene, 1,5-dihydroxynaphthalene, 2,6-dihydroxynaphthalene, and mixtures thereof.

5. The photosensitive resin composition as claimed in claim 1, which further contains (d) a macromolecular straight-chain difunctional epoxy resin.

6. The photosensitive resin composition as claimed in claim 1, which further contains as (e) an organic solvent at least either γ-butyrolactone or propylene carbonate, or both.

7. A photosensitive resin composition laminate which is prepared by providing protective films on both sides of a photosensitive resin composition layer, where said layer is formed from the photosensitive resin composition of claim 1.

8. A pattern forming method which comprises sticking on a substrate of one side (bottom side) of the photosensitive resin composition laminate of claim 7 after the protective layer is removed away therefrom, then removing away the protective layer from on the other side (topside) of the laminate, and thereafter selectively exposing to radiation the photosensitive resin composition layer on the substrate, and developing the said exposed layer to form a resist pattern, then heating it, thereby to form a specified-shaped cured resin pattern.

9. A pattern forming method which comprises sticking on a substrate of one side (bottom side) of the photosensitive resin composition laminate of claim 7 after the protective layer is removed away therefrom, then selectively exposing to radiation the photosensitive resin composition laminate on the substrate, and thereafter removing away the protective layer from on the other side (topside) of the laminate, and developing the exposed photosensitive resin composition to form a resist pattern, then heating it, thereby to form a specified-shaped cured resin pattern.

10. A pattern forming method which comprises applying the photosensitive resin composition of claim 1 on a substrate, drying it, thereby to form a photosensitive resin composition layer, and thereafter selectively exposing to radiation the photosensitive resin composition layer, and developing the said exposed photosensitive resin composition layer to form a resist pattern, then heating it, thereby to form a specified-shaped cured resin pattern.

* * * * *